United States Patent
Mizutani et al.

(10) Patent No.: US 10,119,049 B2
(45) Date of Patent: Nov. 6, 2018

(54) POLISHING AGENT, STORAGE SOLUTION FOR POLISHING AGENT AND POLISHING METHOD

(71) Applicant: HITACHI CHEMICAL COMPANY, LTD., Chiyoda-ku, Tokyo (JP)

(72) Inventors: Makoto Mizutani, Tokyo (JP); Satoyuki Nomura, Tokyo (JP); Haruaki Sakurai, Tokyo (JP); Masaya Nishiyama, Tokyo (JP); Masayuki Hanano, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/736,221

(22) PCT Filed: Jun. 17, 2015

(86) PCT No.: PCT/JP2015/067508
§ 371 (c)(1),
(2) Date: Dec. 13, 2017

(87) PCT Pub. No.: WO2016/203586
PCT Pub. Date: Dec. 22, 2016

(65) Prior Publication Data
US 2018/0179417 A1 Jun. 28, 2018

(51) Int. Cl.
*C09G 1/02* (2006.01)
*B24B 37/00* (2012.01)
(Continued)

(52) U.S. Cl.
CPC ............... *C09G 1/02* (2013.01); *B24B 37/00* (2013.01); *B24B 37/013* (2013.01);
(Continued)

(58) Field of Classification Search
CPC .......................................................... C09G 1/02
(Continued)

(56) References Cited

U.S. PATENT DOCUMENTS

2012/0156968 A1* 6/2012 Kimura ............... C09K 3/1463
451/36

FOREIGN PATENT DOCUMENTS

| JP | 2005-518091 A | 6/2005 |
|---|---|---|
| JP | 2007-144613 A | 6/2007 |

(Continued)

OTHER PUBLICATIONS

International Search Report dated Aug. 25, 2015 for PCT/JP2015/067508, together with English translation thereof (5 pgs).

*Primary Examiner* — Roberts P Culbert
(74) *Attorney, Agent, or Firm* — Fitch, Even, Tabin & Flannery, L.L.P.

(57) ABSTRACT

A polishing agent for chemomechanically polishing a base having a carbon-based material and an insulating material to remove at least a part of the carbon-based material, the carbon-based material having a carbon content of 60 to 95 atm % as measured by X-ray photoelectron spectroscopy, the polishing agent comprising: an abrasive grain comprising silica; an allylamine-based polymer; and water, wherein a mass ratio of a content of the allylamine-based polymer with respect to a content of the abrasive grain is 0.002 to 0.400, and the abrasive grain has a positive charge in the polishing agent.

12 Claims, 2 Drawing Sheets

(51) Int. Cl.
*B24B 37/013* (2012.01)
*C09K 3/14* (2006.01)
*H01L 21/304* (2006.01)
*B24B 37/04* (2012.01)
*H01L 21/3105* (2006.01)

(52) U.S. Cl.
CPC .............. *B24B 37/044* (2013.01); *C09K 3/14* (2013.01); *C09K 3/1409* (2013.01); *H01L 21/304* (2013.01); *H01L 21/31055* (2013.01)

(58) Field of Classification Search
USPC .......................................................... 216/89
See application file for complete search history.

(56) References Cited

FOREIGN PATENT DOCUMENTS

| | | | |
|---|---|---|---|
| JP | 2008-541158 | A | 11/2008 |
| JP | 2009-016788 | A | 1/2009 |
| JP | 2010-056199 | A | 3/2010 |
| JP | 2011-060888 | A | 3/2011 |
| JP | 2012-073606 | A | 4/2012 |
| JP | 2012-142064 | A | 7/2012 |
| JP | 2015-021132 | A | 2/2015 |
| WO | 2006/119709 | A1 | 11/2006 |
| WO | 2012/161202 | A1 | 11/2012 |

\* cited by examiner (a)

(b)

(c)

(d)

(e)

(f)

(g)

(h)

POLISHING AGENT, STORAGE SOLUTION FOR POLISHING AGENT AND POLISHING METHOD

CROSS-REFERENCE TO RELATED APPLICATIONS

This application is a U.S. national phase application filed under 35 U.S.C. § 371 of International Application PCT/JP2015/067508, filed on Jun. 17, 2015, designating the United States, the entire contents of which is hereby incorporated herein by reference.

TECHNICAL FIELD

The present invention relates to a polishing agent, a stock solution of the polishing agent, and a polishing method for chemomechanically polishing (hereinafter, sometimes referred to as "CMP") a base having a carbon-based material having a high carbon content and an insulating material to thereby remove at least a part of the carbon-based material.

BACKGROUND ART

New microfabrication techniques have been developed recently with higher integration and enhanced performance of semiconductor integrated circuits (hereinafter, referred to as "LSI"). CMP is one of such techniques, which is frequently used in a process of manufacturing LSIs (particularly in planarization of interlayer insulating materials, formation of metal plugs, formation of embedded wirings, and the like in a process for forming multilayer wiring).

With higher integration or enhanced performance of LSIs, micronization of pattern rule is also required. An example of the process that has been attracting attention recently is a double patterning process (see, for example, Patent Literature 1 below). In the double patterning process, the first pattern is formed by the first exposure and development, and then, the second pattern is formed on, for example, space portions in the first pattern by the second exposure and development.

Some processes have been suggested as a method for double patterning (see, for example, Patent Literature 2 below). One of examples of double patterning will be described by way of FIG. 1. First, a base having a substrate 1 and silicon oxide 2 is provided wherein the silicon oxide 2 has a prescribed pattern and is also formed on the substrate 1 (FIG. 1(a)). Next, a photoresist 3 is formed on the substrate 1 and silicon oxide 2 (FIG. 1(b)). The whole of the surface layer portion of the photoresist 3 is removed by dry etching so that a prescribed thickness of the photoresist 3 remains on silicon oxide 2 (FIG. 1(c)). A prescribed part of the photoresist 3 on silicon oxide 2 is removed through the exposure and development steps to thereby form a groove 4 in the photoresist 3 (FIG. 1(d)). The part of silicon oxide 2 exposed in the groove 4 is removed by dry etching (FIG. 1(e)). The photoresist 3 is peeled off to obtain silicon oxide 2 having a prescribed pattern (FIG. 1(f)).

CITATION LIST

Patent Literature

Patent Literature 1: Japanese Unexamined Patent Publication No. 2009-16788
Patent Literature 2: Japanese Unexamined Patent Publication No. 2012-73606
Patent Literature 3: Japanese Unexamined Patent Publication No. 2011-60888

SUMMARY OF INVENTION

Technical Problem

As shown in FIG. 1(c), however, slight depressions and projections (for example, depressions and projections of 10 nm or less) on the surface of the photoresist 3 cannot be removed by the conventional method using dry etching, which sometimes results in variation of the thickness of the surface layer portion (the portion upper than the surface of silicon oxide 2 in the direction of lamination) of the photoresist 3.

Variation of the thickness of the surface layer portion of the photoresist was an acceptable level conventionally, but the influence thereof cannot be ignored with recent progress of design rule. For example, in the recess step carried out after application of a photoresist, variation of the thickness of the surface layer portion of the photoresist is further increased. This sometimes results in a deterioration in the form of the device, a decrease in the focal depth, and a decrease in yield.

Under these circumstances, the present inventor has come up with the conception of a method involving a use of CMP instead of dry etching. Specifically, the present inventor has come up with the following conception: for a base having a substrate and an insulating material (for example, silicone oxide) that is formed on the substrate and also has a prescribed pattern, a carbon-based material having a high carbon content is formed on the substrate and the insulating material; the surface layer portion of the carbon-based material is then removed by CMP; and the polishing of the carbon-based material is stopped when the insulating material is exposed.

The compositions of a polishing agent for CMP are generally different depending on the object to be polished (the substance to be removed and the substance to remain without removal). Only a few polishing agents for CMP of a carbon-based material having a high carbon content are known (see, for example, Patent Literature 3 described above). It is difficult to remove a carbon-based material having a high carbon content by polishing with any of polishing agents for other applications (e.g., for polishing glass, for forming STI, or for polishing metallic materials).

Many conventional polishing agents for CMP are polishing agents for polishing relatively hard materials such as inorganic insulating materials or metallic materials, and polishing proceeds due to mechanical action of an abrasive grain comprised in the polishing agents for CMP. However, the carbon-based material having a high carbon content contains an organic compound as a main component, and thus is a softer material than inorganic insulating materials and metallic materials. Therefore, when polishing a carbon-based material having a high carbon content using a conventional polishing agent for CMP, mechanical action of the abrasive grain is dispersed. Thus, polishing hardly proceeds, or polishing proceeds while damaging the carbon-based material having a high carbon content. Therefore, it is difficult to planarize the surface after polishing.

For the process of stopping the polishing of the carbon-based material when the insulating material is exposed, the design of the polishing agent is difficult. The reason for this is that it is necessary not to remove the insulating material while removing the carbon-based material. For example, if the particle diameter of the abrasive grain is increased to thereby enhance the mechanical action of the abrasive grain for the purpose of increasing the polishing rate of the carbon-based material, not only the carbon-based material but also the insulating material are removed.

The present invention is intended to solve the above-mentioned problem, and the object thereof is to provide a polishing agent, a stock solution of the polishing agent, and a polishing method that can remove the carbon-based material having a high carbon content at a favorable polishing rate and also selectively remove the carbon-based material having a high carbon content with respect to the insulating material.

Solution to Problem

The present inventor has conducted intensive studies, and as a result, has found that, by using an abrasive grain comprising silica and also having a positive charge in the polishing agent, and an allylamine-based polymer, the carbon-based material having a high carbon content can be removed at a favorable polishing rate and also selectively removed with respect to the insulating material.

Specifically, the polishing agent of the present invention is a polishing agent for chemomechanically polishing a base having a carbon-based material and an insulating material to remove at least a part of the carbon-based material, the carbon-based material having a carbon content of 60 to 95 atm % as measured by X-ray photoelectron spectroscopy, the polishing agent comprising: an abrasive grain comprising silica; an allylamine-based polymer; and water, wherein a mass ratio of a content of the allylamine-based polymer with respect to a content of the abrasive grain is 0.002 to 0.400, and the abrasive grain has a positive charge in the polishing agent.

According to the polishing agent of the present invention, the carbon-based material having a high carbon content can be removed at a favorable polishing rate and also selectively removed with respect to the insulating material.

The allylamine-based polymer preferably has at least one selected from the group consisting of a structural unit represented by the following general formula (I), a structural unit represented by the following general formula (II), and a structural unit represented by the following general formula (III), a structural unit represented by the following general formula (IV), and a structural unit represented by the following general formula (V). In this case, because the allylamine-based polymer decreases the frequency of contact between the insulating material and the abrasive grain to thereby further suppress the polishing rate of the insulating material, the carbon-based material having a high carbon content can be more selectively removed with respect to the insulating material.

[Chemical Formula 1]

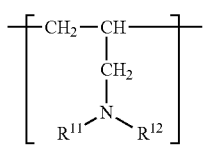

(I)

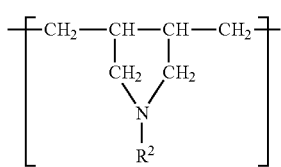

(II)

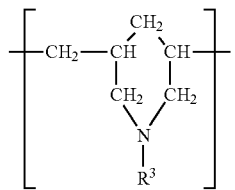

(III)

[In formulae, $R^{11}$, $R^{12}$, $R^2$ and $R^3$ each independently represent a hydrogen atom, an alkyl group or an aralkyl group, and the amino group and the nitrogen-containing ring each independently optionally form an acid addition salt.]

[Chemical Formula 2]

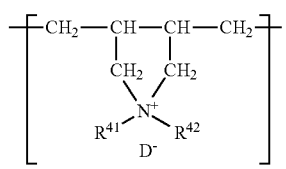

(IV)

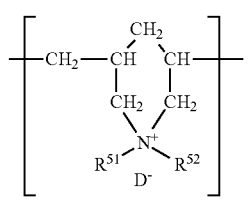

(V)

[In formulae, $R^{41}$ and $R^{42}$ each independently represent an alkyl group or an aralkyl group, $R^{51}$ and $R^{52}$ each independently represent an alkyl group or an aralkyl group, and $D^-$ represents a monovalent anion.]

The silica is preferably colloidal silica. In this case, polishing scratches (which refers to scratches that appear on the polished surface after polishing; the same also applies hereinafter) can be decreased while keeping the high polishing rate of the carbon-based material.

The polishing agent of the present invention may further comprise an organic solvent. In this case, wettability of the polishing agent with the carbon-based material having a high carbon content can be enhanced to thereby further enhance the polishing rate of the carbon-based material.

The pH of the polishing agent of the present invention is preferably 1.0 to 8.0. In this case, the polishing rate of the carbon-based material can be further enhanced, and also dissolution of the abrasive grain can be prevented.

The polishing agent of the present invention may further comprise an acid component. In this case, liquid stability of the polishing agent can be increased, and also the surface to be polished can be planarized more favorably.

In the polishing agent of the present invention, the polishing rate ratio of the carbon-based material with respect to the insulating material is preferably 50 or more.

The polishing agent of the present invention may be stored in a form of a multi-pack polishing agent comprising a first liquid comprising the abrasive grain and water, and a second liquid comprising the allylamine-based polymer and water. In this case, liquid stability of the polishing agent can be increased.

The stock solution of a polishing agent of the present invention is a stock solution of a polishing agent for obtaining the above-mentioned polishing agent, and the stock solution is diluted with water to obtain the polishing agent. In this case, the cost, the space, and the like needed for transportation, storage, and the like of the polishing agent can be reduced.

The first embodiment of the polishing method of the present invention comprises a step of providing a base having a carbon-based material and an insulating material, and a polishing step of chemomechanically polishing the base using the above-mentioned polishing agent to remove at least a part of the carbon-based material, wherein the carbon-based material has a carbon content of 60 to 95 atm % as measured by X-ray photoelectron spectroscopy. The second embodiment of the polishing method of the present invention comprises a step of providing a base having a carbon-based material and an insulating material, a step of diluting the above-mentioned stock solution of a polishing agent with water to obtain the polishing agent, and a polishing step of chemomechanically polishing the base using the polishing agent to remove at least a part of the carbon-based material, wherein the carbon-based material has a carbon content of 60 to 95 atm % as measured by X-ray photoelectron spectroscopy. According to these polishing methods, the carbon-based material having a high carbon content can be removed at a favorable polishing rate and also selectively removed with respect to the insulating material.

In the polishing methods of the present invention, polishing may be stopped when the insulating material is exposed in the polishing step.

Advantageous Effects of Invention

According to the present invention, the carbon-based material having a high carbon content can be removed at a favorable polishing rate, and the carbon-based material having a high carbon content also can be selectively (preferentially) removed with respect to the insulating material.

Further, according to the present invention, it is possible tp provide an use of a polishing agent or a stock solution of a polishing agent for chemomechanically polishing of a base having a carbon-based material and an insulating material to remove at least a part of the carbon-based material. According to the present invention, it is possible to provide an use of a polishing agent or a stock solution of a polishing agent for double patterning. According to the polishing agent of the present invention, it is possible to provide an use of a polishing agent or a stock solution of a polishing agent for polishing to remove at least a part of a carbon-based material (a carbon-based material having a high carbon content) in a wiring board.

DESCRIPTION OF EMBODIMENTS

<Definitions>

Figure 1:
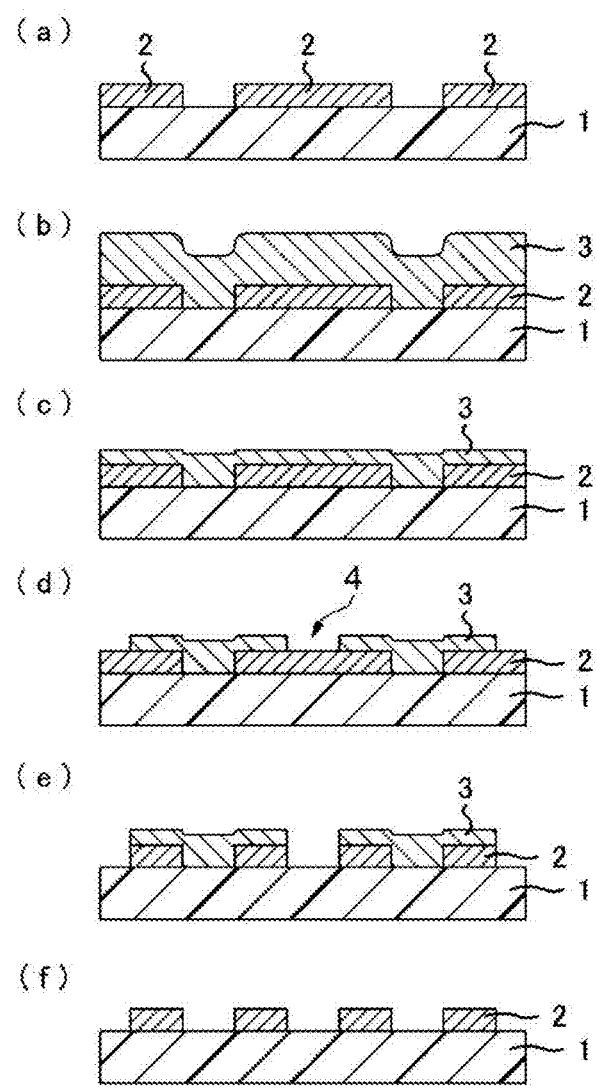
FIG. 1 is a schematic cross-sectional view illustrating a conventional double patterning process.

In the present specification, the term "step" encompasses an independent step as well as a step that cannot be distinguished from another step clearly but achieves an action intended thereby.

In the present specification, numeric values including "to" represents a range including the numeric values written before and after "to" as the minimum value and the maximum value, respectively.

In the present specification, when a plurality of substances corresponding to a component is present in a composition, the content of the component in the composition means the total content of the plurality of substances present in the composition, unless otherwise specified.

In the present specification, the term "polishing rate" means a rate of removing a material to be polished per unit time (i.e., removal rate).

In the present specification, the phrase "selectively remove material A with respect to material B" means that material A is preferentially removed rather than material B. More specifically, it means that material A is preferentially removed rather than material B in a base having material A and material B together.

In the present specification, the phrase "dilute a stock solution of a polishing agent in X-fold" means dilution such that, when water or the like is added to a stock solution of a polishing agent to obtain a polishing agent, the mass of the polishing agent is X times as large as the mass of the stock solution of a polishing agent. For example, when water in the same mass as the mass of a stock solution of a polishing agent is added to the stock solution to obtain a polishing agent, it is defined as diluting a stock solution of a polishing agent in 2-fold.

Embodiments of the present invention now will be described.

<Polishing Agent>

The polishing agent of the present embodiment, which is a composition to be brought into contact with a surface to be polished when polishing, is a polishing agent for CMP, for example.

The polishing agent of the present embodiment is a polishing agent for conducting CMP of a base having a carbon-based material having a carbon content of 60 to 95 atm % as measured by X-ray photoelectron spectroscopy (XPS) (high carbon material) and an insulating material (excluding the carbon-based material described above) to remove at least a part of the carbon-based material. The polishing agent of the present embodiment comprises an abrasive grain comprising silica, an allylamine-based polymer, and water. In the present embodiment, the mass ratio of the content of the allylamine-based polymer with respect to the content of the abrasive grain (the content of the allylamine-based polymer/the content of the abrasive grain) is 0.002 to 0.400, and the abrasive grain has a positive charge (which hereinafter means a surface charge, unless otherwise specified) in the polishing agent.

Because the carbon content of the carbon-based material is 60 atm % or more, the carbon-based material (e.g., a carbon-based material film formed by a carbon-based material) has a moderate hardness, which can prevent the mechanical action of the abrasive grain from dispersing. Thus, the decrease in the polishing rate of the carbon-based material can be prevented. Because the carbon content of the carbon-based material is 95 atm % or less, an excessive hardness of the carbon-based material (e.g., a carbon-based material film) is prevented, and therefore, the mechanical action of the abrasive grain is sufficiently utilized. Thus, a sufficient polishing rate of the carbon-based material can be obtained.

On the above-mentioned grounds, the polishing agent of the present embodiment can remove a carbon-based material at a high polishing rate due to the carbon content of the carbon-based material of 60 to 95 atm %. The carbon content of the carbon-based material is preferably 65 atm % or more, more preferably 70 atm % or more, even more preferably 75 atm % or more, particularly preferably 80 atm % or more, extremely preferably 85 atm % or more, and very preferably 87 atm % or more, from the viewpoint of effectively obtaining the effect of removing the carbon-based material at a high polishing rate. The carbon content of the carbon-based material is preferably 95 atm % or less, more preferably 93 atm % or less, and even preferably 91 atm % or less, from the viewpoint of effectively obtaining the effect of removing the carbon-based material at a high polishing rate.

The carbon content of the carbon-based material is measured by X-ray photoelectron spectroscopy. The analysis by X-ray photoelectron spectroscopy can be conducted using, for example, "PHI-5000-VersaProbeII" manufactured by ULVAC-PHI, INCORPORATED. In this case, a monochromatic Al-Kα ray (1486.6 eV) can be used as the X-ray source. Measurement conditions are, for example, a detection angle of 45 degrees, an area for analysis of 200 μmΦ, a voltage of 15 kV, and an output of 50 W. The carbon content can be obtained by measuring C1s (280 to 300 eV) spectrum, conducting charge correction taking the C1s peak top measured as 284.3 eV, and determining the area of the C1s peak.

The carbon-based material is not particularly limited as long as the aforementioned carbon content is satisfied. Examples of the carbon-based material include resin materials such as a phenol resin, an epoxy resin, an acrylic resin, a methacrylic resin, a novolac resin, an unsaturated polyester resin, a polyester resin (excluding the unsaturated polyester resin), a polyimide resin, a polyamide imide resin, polybenzoxazole (PBO), a polyallyl ether resin, a heterocycle-containing resin (excluding the resins exemplified above), and a silicone-containing resin. Examples of the method for forming the carbon-based material include, but not particularly limited to, vapor deposition and spin coating. Examples of the shape of the carbon-based material include, but not particularly limited to, film form (a carbon-based material film).

The insulating material is not particularly limited, and various known insulating materials can be used. Specifically, examples thereof include a silicon-based insulating material. Examples of the silicon-based insulating material include silica-based materials such as silicon oxide, fluorosilicate glass, organosilicate glass, silicon oxynitride, and hydrogenated silsesquioxane; silicon carbide; and silicon nitride. The insulating material may be doped with an element such as phosphorus and boron.

It is considered that, in the case of removing a carbon-based material by CMP, the polishing rate of the carbon-based material tends to be high when an abrasive grain having a positive charge in a polishing agent is used. It is also considered that an abrasive grain comprising silica has higher affinity for the carbon-based material than other kinds of abrasive grains, and therefore, frequency of contact between the abrasive grain and the carbon-based material is increased. Therefore, it is considered that the polishing rate of the carbon-based material is high when an abrasive grain comprising silica and also having a positive charge in a polishing agent is used.

On the other hand, the abrasive grain comprising silica also has a high affinity for the insulating material. Because the surface of the insulating material has a negative charge over a wide range of pH, the abrasive grain having a positive charge in a polishing agent is electrostatically adsorbed to the insulating material. Therefore, when an abrasive grain comprising silica and also having a positive charge in a polishing agent is used, not only the polishing rate of the carbon-based material but also that of the insulating material tend to increase.

However, the present inventor has found that, since the polishing agent of the present embodiment comprises an allylamine-based polymer, the polishing rate of the insulating material can be drastically decreased, and the polishing rate of the carbon-based material is only slightly decreased or hardly changed.

It is considered that the above-mentioned effect is obtained according to the following reason. It is considered that the allylamine-based polymer is preferentially adsorbed to the surface of the insulating material relatively to that of the carbon-based material. Therefore, a protective film produced due to the allylamine-based polymer is formed more preferentially on the surface of the insulating material relatively to that of the carbon-based material. Thus, the frequency of contact between the abrasive grain and the insulating material decrease to thereby decrease the polishing rate of the insulating material.

Due to the foregoing, the polishing agent of the present embodiment can remove the carbon-based material at a favorable polishing rate, and also, it can selectively remove the carbon-based material with respect to the insulating material. In other words, the polishing agent of the present embodiment can obtain a high polishing rate of the carbon-based material and also obtain a high selective polishing ratio of the carbon-based material with respect to the insulating material (the polishing rate of the carbon-based material/the polishing rate of the insulating material).

The components comprised in the polishing agent of the present embodiment and the like will be now described in detail.

(Abrasive Grain)

The polishing agent of the present embodiment comprises an abrasive grain comprising silica. The abrasive grain has a positive charge in the polishing agent. It is considered that, since silica has a higher affinity for the carbon-based material than other kinds of abrasive grains, frequency of contact between the abrasive grain and the carbon-based material is increased.

Whether an abrasive grain has a positive charge in a polishing agent can be determined by measuring the zeta potential of the abrasive grain in the polishing agent. When a zeta potential of an abrasive grain in a polishing agent is measured and found to be more than 0 mV, it can be determined that the abrasive grain has a positive charge in the polishing agent.

The zeta potential can be measured with a product name DELSA NANO C manufactured by Beckman Coulter, Inc., for example. The zeta potential ($\zeta$ [mV]) can be measured according to the following procedure. First, the polishing agent is diluted with pure water to obtain a sample such that the scattering intensity of the sample for measurement is $1.0 \times 10^4$ to $5.0 \times 10^4$ cps (where "cps" indicates counts per second, which is a unit of the number of particles counted) with a zeta potential measurement device. Then, the sample is placed in a cell for measuring the zeta potential and the zeta potential is measured. To adjust the scattering intensity within the above-mentioned range, the polishing agent is diluted such that the content of the abrasive grain is 1.7 to 1.8% by mass, for example.

Examples of the approach for adjusting the abrasive grain so as to have a positive charge in a polishing agent include controlling the method for producing the abrasive grain, adjusting the pH of the polishing agent, and conducting surface treatment of the abrasive grain. The case where silica is used as the abrasive grain will be described as an example. Generally, silica has a negative charge in a liquid, but tends to have a positive charge when the pH is decreased. Silica also can be surface-treated with a coupling agent having a cationic group.

From the viewpoint of obtaining a more favorable polishing rate and storage stability, the zeta potential is preferably 10 mV or more, more preferably 15 mV or more, and even more preferably 18 mV or more. The upper limit of the zeta potential is not particularly limited, and for example is 100 mV.

Examples of silica include colloidal silica and fumed silica, and among them, colloidal silica is preferred from the viewpoint of further increase in the polishing rate of the carbon-based material, less polishing scratches, and ease to select the particle diameter.

The abrasive grain can comprise a particle other than silica. For example, the abrasive grain may comprise a particle of alumina, ceria, zirconia, cerium hydroxide, resin, or the like. The abrasive grain may comprise a composite particle obtained by adhering a particle other than a silica particle to the surface of a silica particle, and may comprise a composite particle obtained by adhering a silica particle to the surface of a particle other than a silica particle. The abrasive grains may be used singly or in combinations of two or more thereof.

From the viewpoint of further increasing the polishing rate of the carbon-based material, the content of the silica is preferably more than 50% by mass, more preferably 60% by mass or more, even more preferably 70% by mass or more, particularly preferably 80% by mass or more, extremely preferably 90% by mass or more, and very preferably 95% by mass or more, based on the total mass of the abrasive grain.

From the viewpoint of easily obtaining a sufficient mechanical polishing power and further increasing the polishing rate of the carbon-based material, the content of the silica is preferably 0.005 parts by mass or more, more preferably 0.05 parts by mass or more, even more preferably 0.10 parts by mass or more, particularly preferably 0.15 parts by mass or more, with respect to 100 parts by mass of the polishing agent. From the viewpoint of easily preventing the increase in the viscosity of the polishing agent, easily preventing agglomeration of the abrasive grain, easily lessening polishing scratches, handling the polishing agent with ease, and the like, the content of the silica is preferably 15 parts by mass or less, more preferably 10 parts by mass or less, even more preferably 5 parts by mass or less, and particularly preferably 3 parts by mass or less, with respect to 100 parts by mass of the polishing agent.

From the viewpoint of easily obtaining a sufficiently significant polishing rate of the carbon-based material in comparison with a polishing rate of the carbon-based material in a case of comprising no abrasive grain, the content of the abrasive grain is preferably 0.01 parts by mass or more, more preferably 0.05 parts by mass or more, and even more preferably 0.1 parts by mass or more, with respect to 100 parts by mass of the polishing agent. From the viewpoint of obtaining a good dispersing stability of the abrasive grain while increasing the polishing rate of the carbon-based material, the content of the abrasive grain is preferably 10 parts by mass or less, more preferably 6 parts by mass or less, even more preferably 4 parts by mass or less, and particularly preferably 3 parts by mass or less, with respect to 100 parts by mass of the polishing agent.

From the viewpoint of easily obtaining a sufficient mechanical polishing power and further increasing the polishing rate of the carbon-based material, the average particle diameter of the abrasive grain is preferably 10 nm or more, more preferably 30 nm or more, and even more preferably 40 nm or more. From the viewpoint of obtaining a good dispersing stability of the abrasive grain, the average particle diameter of the abrasive grain is preferably 200 nm or less, more preferably 120 nm or less, even more preferably 100 nm or less, and particularly preferably 90 nm or less.

The average particle diameter of the abrasive grain can be determined according to photon correlation method. Specifically, for example, the average particle diameter can be measured with device name of Zetasizer 3000HS manufactured by Malvern Instruments Ltd, device name of N5 manufactured by Beckman Coulter, Inc, or the like. The measurement method using N5 is as follows. Specifically, for example, an aqueous dispersion having the content of the abrasive grain adjusted to 0.2% by mass, and about 4 mL ("L" means liter; the same also applies hereinafter) of the aqueous dispersion is placed in a 1 cm-square cell, followed by setting the cell in the device. The refractive index of the dispersion medium is set to 1.33 and the viscosity of the dispersion medium is set to 0.887 mPa·s, and the value obtained by the measurement conducted at a temperature of 25° C. can be taken as the average particle diameter of the abrasive grain.

(Polymer)

The polishing agent of the present embodiment comprises an allylamine-based polymer. In the present specification, the "allylamine-based polymer" is defined as a polymer having a structural unit obtained by polymerizing a monomer comprising an allylamine-based compound. In the present specification, the "allylamine-based compound" is defined as a compound having an allyl group and an amino group. The allylamine based polymer may have a structural unit obtained by polymerizing only the allylamine-based compound(s), or may have a structural unit obtained by copolymerizing an allylamine-based compound and a compound other than the allylamine-based compounds. The allylamine-based compounds may be used singly or in combinations of two or more thereof.

From the viewpoint of easily suppressing the polishing rate of the insulating material, the weight average molecular weight of the allylamine-based polymer is preferably 500 or more, more preferably 800 or more, and even more preferably 1000 or more. From the viewpoint of preventing an excessively high viscosity to obtain good storage stability, the weight average molecular weight of the allylamine-based polymer is preferably 300000 or less, more preferably 200000 or less, and even more preferably 150000 or less.

The weight average molecular weight (Mw) of the allylamine-based polymer can be obtained, for example, using gel permeation chromatography (GPC) under the following conditions.

[Conditions]

Sample: 20 μL

Standard Polyethylene glycol: standard Polyethylene glycols (molecular weight: 106, 194, 440, 600, 1470, 4100, 7100, 10300, 12600, 23000), manufactured by Polymer Laboratories Ltd.

Detector: RI-monitor, product name "Syodex-RI SE-61", manufactured by SHOWA DENKO K.K.

Pump: manufactured by Hitachi, Ltd., product name "L-6000"

Columns: columns of product names "GS-220HQ" and "GS-620HQ", manufactured by SHOWA DENKO K.K., are connected in this order and used Eluent: 0.4 mol/L aqueous solution of sodium chloride
Measurement Temperature: 30° C.
Flow rate: 1.00 mL/min
Measurement time: 45 minutes From the viewpoint of easily suppressing the polishing rate of the insulating material, the content of the allylamine-based polymer is preferably 0.001 parts by mass or more, more preferably 0.003 parts by mass or more, even more preferably 0.004 parts by mass or more, and particularly preferably 0.005 parts by mass or more, with respect to 100 parts by mass of the polishing agent. From the viewpoint of preventing decrease in the polishing rate of the carbon-based material and easily keeping a high polishing rate ratio of the carbon-based material with respect to the insulating material, the content of the allylamine-based polymer is preferably 0.400 parts by mass or less, more preferably 0.300 parts by mass or less, even more preferably 0.200 parts by mass or less, and particularly preferably 0.100 parts by mass or less, with respect to 100 parts by mass of the polishing agent.

The mass ratio of the content of the allylamine-based polymer with respect to the content of the abrasive grain is 0.002 or more from the viewpoint of selectively removing the carbon-based material with respect to the insulating material. The mass ratio is preferably 0.003 or more and more preferably 0.005 or more, from the viewpoint of easily selectively removing the carbon-based material with respect to the insulating material.

The mass ratio of the content of the allylamine-based polymer with respect to the content of the abrasive grain is 0.400 or less from the viewpoint of removing the carbon-based material at a favorable polishing rate. The mass ratio is preferably 0.300 or less and more preferably 0.200 or less, from the viewpoint of easily removing the carbon-based material at a favorable polishing rate.

From the viewpoint of more selectively removing the carbon-based material with respect to the insulating material, the allylamine-based polymer preferably has, in the molecule thereof, at least one selected from the group consisting of a structural unit represented by the following general formula (I), a structural unit represented by the following general formula (II), a structural unit represented by the following general formula (III), a structural unit represented by the following general formula (IV), and a structural unit represented by the following general formula (V).

[Chemical Formula 3]

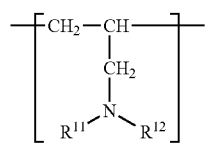
(I)

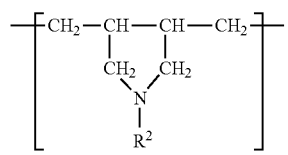
(II)

-continued

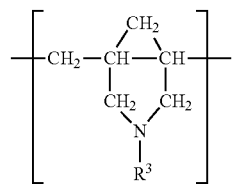
(III)

[In formulae, $R^{11}$, $R^{12}$, $R^2$ and $R^3$ each independently represent a hydrogen atom, an alkyl group or an aralkyl group; the alkyl group and the aralkyl group each optionally have a hydroxy group; the amino group and the nitrogen-containing ring each independently optionally form an acid addition salt; and $R^{11}$ and $R^{12}$ may be the same or different from each other.]

[Chemical Formula 4]

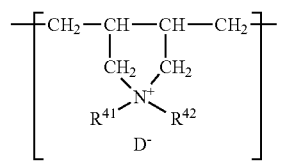
(IV)

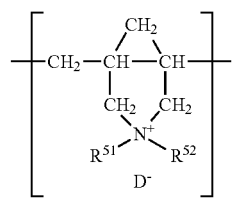
(V)

[In formulae, $R^{41}$ and $R^{42}$ each independently represent an alkyl group or an aralkyl group; the alkyl group and the aralkyl group each optionally have a hydroxy group; $R^{51}$ and $R^{52}$ each independently represent an alkyl group or an aralkyl group; if represents a monovalent anion; $R^{41}$ and $R^{42}$ may be the same or different from each other; and $R^{51}$ and $R^{52}$ may be the same or different from each other.]

The allylamine-based polymer may have only one of the structural units (I) to (V), or may have two or more thereof. The total number of the structural units (I) to (V) in the molecule is preferably 5 or more, more preferably 7 or more, and even more preferably 10 or more, from the viewpoint of easily suppressing the polishing rate of the insulating material. Here, the total number of the structural units (I) to (V) in the molecule is the average value in the allylamine-based polymer comprised in the polishing agent.

The alkyl group of $R^{11}$, $R^{12}$, $R^2$ and $R^3$ in general formulae (I), (II), and (III) may be any of straight, branched, or cyclic. The number of carbon atoms of the alkyl group is preferably 1 or more from the viewpoint of easily suppressing the polishing rate of the insulating material. The number of carbon atoms of the alkyl group is preferably 10 or less, more preferably 7 or less, even more preferably 5 or less, and particularly preferably 4 or less, from the viewpoint of easily suppressing the polishing rate of the insulating material.

The alkyl group of $R^{11}$, $R^{12}$, $R^2$ and $R^3$ may have a hydroxy group. Examples of the alkyl group of $R^{11}$, $R^{12}$, $R^2$ and $R^3$ include a methyl group, an ethyl group, a n-propyl group, an isopropyl group, a n-butyl group, an iso-butyl group, a tert-butyl group, a cyclohexyl group, and hydroxyl group adducts thereof (e.g., 3-hydroxypropyl group).

The aralkyl group refers to a group formed by replacing a hydrogen atom of an alkyl group with an aryl group. The alkyl group constituting the aralkyl group of $R^{11}$, $R^{12}$, $R^2$ and $R^3$ in general formulae (I), (II), and (III) may be any of straight, branched, or cyclic. The number of carbon atoms of the aralkyl group is preferably 7 to 10 from the viewpoint of easily suppressing the polishing rate of the insulating material.

The aralkyl group of $R^{11}$, $R^{12}$, $R^2$ and $R^3$ may have a hydroxy group. Examples of the aralkyl group include a benzyl group, a phenylethyl group, a phenylpropyl group, a phenylbutyl group, phenylhexyl group, and hydroxyl group adducts thereof.

The amino group in general formula (I) and the nitrogen-containing ring in general formulae (II) and (III) may form an acid addition salt. Examples of the acid addition salt include a hydrochloride, a hydrobromate, an acetate, a sulfate, a nitrate, a sulfite, a phosphate, an amide sulfate, and a methanesulfonate. Among these, a hydrochloride, an acetate, and an amide sulfate are preferable from the viewpoint of obtaining an even higher polishing rate ratio of the carbon-based material with respect to the insulating material.

Among the above, $R^{11}$, $R^{12}$, $R^2$ and $R^3$ are preferably any of a hydrogen atom, a methyl group, and an ethyl group from the viewpoint of good wettability with the insulating material (e.g., silicon oxide).

Among the allylamine-based polymer having a structural unit represented by general formula (I), (II), or (III), an polyallylamine and polydiallylamine are preferable from the viewpoint of obtaining an even higher polishing selective ratio of the carbon-based material with respect to the insulating material. For the same viewpoint, diallylamine hydrochloride, methyldiallylamine hydrochloride, ethyldiallylamine hydrochloride, methyldiallylamine acetate, and methyldiallylamine amide sulfate are preferable as the structural unit containing an acid addition salt.

The alkyl group of $R^{41}$, $R^{42}$, $R^{51}$ and $R^{52}$ in general formulae (IV) and (V) may be any of straight, branched, or cyclic. The number of carbon atoms of the alkyl group of $R^{41}$ and $R^{42}$ is preferably 1 or more from the viewpoint of easily suppressing the polishing rate of the insulating material. The number of carbon atoms of the alkyl group of $R^{41}$ and $R^{42}$ is preferably 10 or less, more preferably 7 or less, and even more preferably 4 or less, from the viewpoint of easily suppressing the polishing rate of the insulating material. The number of carbon atoms of the alkyl group of $R^{51}$ and $R^{52}$ is preferably 1 or more from the viewpoint of easily suppressing the polishing rate of the insulating material. The number of carbon atoms of the alkyl group of $R^{51}$ and $R^{52}$ is preferably 10 or less, more preferably 7 or less, and even more preferably 4 or less, from the viewpoint of easily suppressing the polishing rate of the insulating material.

The alkyl group of $R^{41}$ and $R^{42}$ may have a hydroxy group. Examples of the alkyl group of $R^{41}$ and $R^{42}$ include a methyl group, an ethyl group, a n-propyl group, an isopropyl group, a n-butyl group, an iso-butyl group, a tert-butyl group, a cyclohexyl group, and hydroxyl group adducts thereof (e.g., 3-hydroxypropyl group).

Examples of the alkyl group of $R^{51}$ and $R^{52}$ include a methyl group, an ethyl group, a n-propyl group, an isopropyl group, a n-butyl group, an iso-butyl group, a tert-butyl group, and a cyclohexyl group.

The alkyl group constituting the aralkyl group of $R^{41}$, $R^{42}$, $R^{51}$ and $R^{52}$ in general formulae (IV) and (V) may be any of straight, branched, or cyclic. The number of carbon atoms of the aralkyl group is preferably 7 to 10 from the viewpoint of easily suppressing the polishing rate of the insulating material.

The aralkyl group of $R^{41}$ and $R^{42}$ may have a hydroxy group. Examples of the aralkyl group include a benzyl group, a phenylethyl group, a phenylpropyl group, a phenylbutyl group, and hydroxyl group adducts thereof.

Examples of the aralkyl group of $R^{51}$ and $R^{52}$ include a benzyl group, a phenylethyl group, a phenylpropyl group, and a phenylbutyl group.

Among the above, $R^{41}$, $R^{42}$, $R^{51}$ and $R^{52}$ are preferably any of a methyl group, a benzyl group, and a phenylethyl group from the viewpoint of good wettability with the insulating material (e.g., silicon oxide).

Examples of $D^-$ in general formulae (IV) and (V) include halogen ions such as $Cl^-$, $Br^-$, and $I^-$; and alkyl sulfate ions such as a methylsulfate ion, an ethylsulfate ion, and dimethylsulfate ion.

Examples of the partial structure represented by the following general formula (IVa) in general formula (IV) and the partial structure represented by the following general formula (Va) in general formula (V) include an N,N-dialkylammonium salt and an N-alkyl-N-benzylammonium salt. Examples of the N,N-dialkylammonium salt include an N,N-dialkylammonium halide such as an N,N-dimethylammonium halide, an N,N-diethylammonium halide, an N,N-dipropylammonium halide, and an N,N-dibutylammonium halide; and an N,N-dialkylammonium alkyl sulfate such as N,N-dimethyl ammonium methylsulfate and N,N-methylethylammonium ethylsulfate. Examples of the N-alkyl-N-benzylammonium salt include an N-alkyl-N-benzylammonium halide such as an N-methyl-N-benzylammonium halide and an N-ethyl-N-benzylammonium halide. Examples of the halide in the partial structure include chloride, bromide, and iodide. Among structural units having any of these partial structures, N,N-dimethylammonium chloride and N,N-methylethylammonium ethylsulfate are preferable from the viewpoint of obtaining an even higher polishing rate ratio of the carbon-based material with respect to the insulating material.

[Chemical Formula 5]

(IVa)

(Va)

The allylamine-based polymer may have a structure obtained by copolymerizing an allylamine-based compound and a compound other than allylamine-based compounds. The allylamine-based polymer may have a structure obtained by copolymerizing, for example, a monomer providing at least one structural unit selected from the group consisting of a structural unit represented by general fonnula (I), a structural unit represented by general formula (II), and a structural unit represented by general foiniula (III), and a monomer other than allylamine-based compounds.

The allylamine-based polymer may further have at least one selected from the group consisting of a structural unit represented by the following general formula (VI), a structural unit represented by the following formula (VII), a structural unit represented by the following general formula (VIII), and a structural unit represented by the following general formula (IX). For example, the allylamine-based polymer may have at least one structural unit selected from the group consisting of a structural unit represented by general formula (I), a structural unit represented by general formula (II), a structural unit represented by general foiniula (III), a structural unit represented by general formula (IV), and a structural unit represented by general formula (V); and at least one structural unit selected from the group consisting of a structural unit represented by the following general formula (VI), a structural unit represented by the following formula (VII), a structural unit represented by the following general formula (VIII), and a structural unit represented by the following general formula (IX).

[Chemical Formula 6]

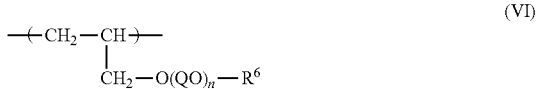

(VI)

[In formula (VI), Q represents an alkylene group; $R^6$ represents a hydroxy atom or an alkyl group; and n represents an average number of moles added of 0 to 30.]

[Chemical Formula 7]

(VII)

[Chemical Formula 8]

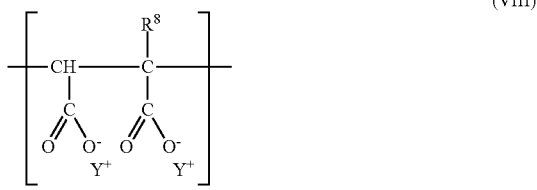

(VIII)

[In formula (VIII), $R^8$ represents a hydroxy atom or an alkyl group; and $Y^+$ represents a cation.]

[Chemical Formula 9]

(IX)

[In formula (IX), $R^9$ represents a hydroxy atom or an alkyl group.]

Examples of the monomer providing the structural unit represented by general formula (VI) when n is 0 include allyl alcohol. Examples of the monomer providing the structural unit represented by general formula (VI) when n is 1 to 30 include (poly)oxyalkylene monoallyl ether, and (poly)oxyalkylene monoallyl monomethyl ether. In this case, the alkylene group represented by Q is preferably a straight or branched alkylene group having 2 to 3 carbon atoms, and more preferably an ethylene group, a trimethylene group, or a propylene group, from the viewpoint of easily suppressing the polishing rate of the insulating material. The alkylene groups may be introduced singly or in combinations of two or more thereof. $R^6$ is preferably a hydroxy atom or a methyl group from the viewpoint of easily suppressing the polishing rate of the insulating material.

As the allylamine-based polymer having the structural unit represented by general formula (VI), a copolymer of diallylmethylamine hydrochloride and allyl alcohol is preferable from the viewpoint of obtaining an even higher polishing rate ratio of the carbon-based material with respect to the insulating material.

Examples of the monomer providing the structural unit represented by formula (VII) include sulfur dioxide. As the allylamine based polymer having the structural unit represented by formula (VII), a copolymer of diallylamine hydrochloride and sulfur dioxide is preferable from the viewpoint of obtaining an even higher polishing rate ratio of the carbon-based material with respect to the insulating material.

$R^8$ in general formula (VIII) is preferably a hydroxy atom or a methyl group and more preferably a hydroxy atom, from the viewpoint of easily suppressing the polishing rate of the insulating material. Examples of $Y^+$ include alkali metal ions such as sodium ion and potassium ion; a hydrogen ion; and an ammonium ion.

Examples of the monomer providing the structural unit represented by general formula (VIII) include maleic acid, fumaric acid, citraconic acid, itaconic acid, mesaconic acid, and 2-allylmalonic acid, and among them, maleic acid is preferable from the viewpoint of easily reducing the polishing rate of the insulating material and from the viewpoint of good dispersibility of the allylamine-based polymer in the polishing agent.

As the allylamine-based polymer having the structural unit represented by general formula (VIII), a copolymer of diallylamine hydrochloride and maleic acid, and a copolymer of diallylamine amide sulfate and maleic acid are preferable from the viewpoint of obtaining an even higher polishing rate ratio of the carbon-based material with respect to the insulating material.

$R^9$ in general formula (IX) is preferably a hydroxy atom or a methyl group and more preferably a hydroxy atom, from the viewpoint of easily suppressing the polishing rate of the insulating material. Examples of the monomer providing the structural unit represented by general formula (IX) include acrylamide.

As the allylamine-based polymer having the structural unit represented by general formula (IX), a copolymer of diallylmethylammonium chloride and acrylamide, and a copolymer of diallyldimethylammonium chloride and acrylamide are preferable from the viewpoint of obtaining an even higher polishing rate ratio of the carbon-based material with respect to the insulating material.

As the allylamine-based polymer, a polymer of methyldiallylamine amide sulfate, polyallylamine, a copolymer of diallyldimethylammonium chloride and acrylamide, and a copolymer of diallylamine hydrochloride and sulfur dioxide are preferable from the viewpoint of obtaining an even higher polishing rate ratio of the carbon-based material with respect to the insulating material.

(Water)

The polishing agent of the present embodiment comprises water. Water is used as a dispersion medium for other components, or a solvent. Water that contains impurities as little as possible is preferable to prevent inhibition of the actions of other components. Specifically, preferred water is pure water and ultrapure water obtained by removing impurity ions with an ion exchange resin and then passing through a filter to remove foreign matters; and distilled water.

(Additives)

The polishing agent of the present embodiment may further comprise any of components other than the abrasive grain, the allylamine-based polymer, and water for the purpose of improvement in dispersibility of the abrasive grain in the polishing agent, improvement in chemical stability of the polishing agent, improvement in the polishing rate, and the like. Examples of such components include additives such as an organic solvent, an acid component, a corrosion inhibitor, and a defoaming agent. The content of the additives in the polishing agent can be arbitrarily determined as long as they do not impair the properties of the polishing agent.

[Organic Solvent]

The polishing agent of the present embodiment may comprise an organic solvent. When the polishing agent comprises an organic solvent, the polishing rate ratio can be adjusted and also the wettability of the polishing agent can be improved. The organic solvent is preferably, but not limited to, a solvent that is in a liquid state at 20° C. The solubility of the organic solvent in 100 g of water (20° C.) is preferably 30 g or more, more preferably 50 g or more, and even more preferably 100 g or more, from the viewpoint of highly concentrating the polishing agent. The organic solvents can be used singly or in combinations of two or more thereof.

Examples of the organic solvents include carbonate esters such as ethylene carbonate, propylene carbonate, dimethyl carbonate, diethyl carbonate, and methylethyl carbonate; lactones such as butyrolactone and propiolactone; glycols such as ethylene glycol, propylene glycol, diethylene glycol, dipropylene glycol, triethylene glycol, and tripropylene glycol; derivatives of glycols such as glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol mono ethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether, and glycol diethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether. Among these, at least one selected from the group consisting of glycols and derivatives of glycols is preferable from the viewpoint of low surface tension, and glycol monoethers are more preferable from the viewpoint of lower surface tension.

When the polishing agent of the present embodiment comprises an organic solvent, the content of the organic solvent is preferably 0.100 parts by mass or more, more preferably 0.500 parts by mass or more, and even more preferably 1.000 part by mass or more, with respect to 100 parts by mass of the polishing agent from the viewpoint of preventing decrease in wettability of the polishing agent with the carbon-based material. The content of the organic solvent is preferably 15.000 parts by mass or less, more preferably 10.000 parts by mass or less, and even more preferably 5.000 parts by mass or less, with respect to 100 parts by mass of the polishing agent from the viewpoint of excellent dispersion stability.

[Acid Component]

The polishing agent of the present embodiment may comprise an acid component. When the polishing agent of the present embodiment comprises an acid component to control the pH, liquid stability of the polishing agent is enhanced and also the surface to be polished is further favorably planarized. The acid component is preferably at least one selected from the group consisting of organic acids and inorganic acids from the viewpoint of capable of further improving dispersibility and stability of the aqueous dispersion and the polishing rate. Examples of the organic acids include, but not limited to, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, and citric acid. Examples of the inorganic acids include, but not limited to, hydrochloric acid, sulfuric acid, nitric acid, and chromic acid.

(pH of Polishing Agent)

The pH of the polishing agent of the present embodiment is preferably 1.0 or more, more preferably 1.5 or more, even more preferably 2.0 or more, and particularly preferably 2.3 or more, from the viewpoint of easily obtaining a sufficient mechanical polishing power to result in further increase in the polishing rate of the carbon-based material. The pH of the polishing agent is preferably 8.0 or less, more preferably 5.0 or less, even more preferably 4.0 or less, particularly preferably 3.5 or less, and extremely preferably 3.0 or less, from the viewpoint of obtaining good dispersing stability of the abrasive grain. The pH of the polishing agent may be adjusted by the above-mentioned acid component; a basic component such as ammonia, sodium hydroxide, potassium hydroxide, or TMAH (tetramethylammonium hydride); or the like. The pH is defined as a pH at a liquid temperature of 25° C.

The pH of the polishing agent can be measured using a common pH meter with a glass electrode. Specifically, a product name Model (F-51) manufactured by HORIBA, Ltd. can be used, for example. After conducting three-point calibration of a pH meter using a phthalate pH standard solution (4.01), a neutral phosphate pH standard solution (pH 6.86), and a borate pH standard solution (pH 9.18) as pH standard solutions, the electrode of the pH meter is placed in the polishing agent, and left to stand for two minutes or more to stabilize, and then the stabilized value is measured. In this case, the liquid temperature of the standard buffers and the polishing agent is 25° C., for example.

The method for preparing the polishing agent and the method for diluting the polishing agent are not particularly limited, and for example, the components can be dispersed or dissolved by stirring using a propeller stirrer, by ultrasonic dispersion, or the like. The order in which the components are mixed with water is not limited.

The polishing agent of the present embodiment may be stored in the form of a one-pack polishing agent comprising at least the abrasive grain, the allylamine-based polymer, and water, or may be stored in the form of a multi-pack polishing agent comprising a slurry (the first liquid) and an additive liquid (the second liquid). For the multi-pack polishing agent, the ingredients of the polishing agent are divided into the slurry and the additive liquid so that the polishing agent can be obtained when the slurry and the additive liquid are mixed together. The slurry contains at least, for example, the abrasive grain and water. The additive liquid contains at least, for example, the allylamine-based polymer and water. The additives such as an organic solvent, an acid component, a corrosion inhibitor, and a defoaming agent are preferably contained in the additive liquid among the slurry and the additive liquid. The ingredients of the polishing agent may be divided into three or more packs and stored.

As for the multi-pack polishing agent, the polishing agent may be prepared by mixing the slurry and the additive liquid immediately before polishing or at the time of polishing. The slurry and the additive liquid of a multi-pack polishing agent may separately be fed on a polishing platen, and a surface to be polished may be polished using the polishing agent obtained by mixing the slurry and the additive liquid together on the polishing platen.

<Stock Solution of Polishing Agent>

The stock solution of a polishing agent of the present embodiment is a stock solution for obtaining the above-mentioned polishing agent, and the polishing agent can be obtained by diluting the stock solution of a polishing agent with water. The stock solution of a polishing agent is stored in a state where the stock solution contains a reduced amount of water compared to that when used, and the stock solution is diluted with water before use or at the time of use and then used as a polishing agent. The stock solution of a polishing agent is different from the above-mentioned polishing agent in that the water content of the stock solution is smaller than that of the polishing agent. The degree of dilution is 1.5-fold or more, for example.

<Polishing Method>

Next, the polishing method of the present embodiment will be described.

In the polishing method of the present embodiment, a base having a carbon-based material and an insulating material is subjected to CMP to selectively polish the carbon-based material with respect to the insulating material. The base has an insulating material (e.g., an insulating film) and a carbon-based material, wherein the insulating material has depressions and projections on the surface thereof, and the carbon-based material is formed on the insulating material so as to follow the shape of the insulating material. Polishing in the polishing method of the present embodiment may be polishing for removing at least a part of the carbon-based material of a wiring board.

For example, as a polishing step, the polishing method of the present embodiment may comprise a CMP step of subjecting the base to CMP using a one-pack polishing agent to remove at least a part of the carbon-based material; a CMP step of subjecting the base to CMP using a polishing agent obtained by mixing a slurry and an additive liquid of a multi-pack polishing agent to remove at least a part of the carbon-based material; a CMP step of subjecting the base to CMP using a polishing agent obtained by diluting a stock solution of a polishing agent with water to remove at least a part of the carbon-based material. In the CMP step, for example, polishing may be stopped when the carbon-based material is polished and the insulating material is exposed.

The polishing method of the present embodiment may comprise a step of providing a base having a carbon-based material having a carbon content of 60 to 95 atm % as measured by X-ray photoelectron spectroscopy and an insulating material, before the CMP step.

In cases where a multi-pack polishing agent is used, the polishing method of the present embodiment may comprise a polishing agent-preparing step of mixing a slurry and an additive liquid of the multi-pack polishing agent to obtain a polishing agent, before the CMP step. In cases where a stock solution of a polishing agent is used, the polishing method of the present embodiment may comprise a polishing agent-preparing step of diluting the stock solution of a polishing agent with water to obtain the polishing agent, before the CMP step.

In the CMP step, for example, the base is moved relatively with respect to the polishing platen to polish the surface to be polished, at the state where the surface to be polished of the base is pressed on the polishing cloth (polishing pad) of a polishing platen, the polishing agent is fed between the surface to be polished and the polishing cloth, and a prescribed pressure is applied to the back surface (the surface opposite to the surface to be polished) of the base.

For example, as a polishing device, it is possible to use a common polishing device having a platen, and a holder for holding a base, wherein a motor whose number of rotations is changeable or the like is attached to the platen, and a polishing pad can be attached to the platen. As a polishing cloth, without limitation, it is possible to use a common non-woven fabrics, a polyurethane foam, a porous fluorinated resin. Polishing conditions are not particularly limited; the rotational speed of the platen is preferably as low as 200 rpm ($=min^{-1}$) or less so that the base does not come off. For example, the polishing agent is continuously fed to the polishing cloth using a pump or the like during polishing. The amount fed is not limited; it is preferable that the surface of the polishing cloth is always coated with the polishing agent, and also that a product produced due to the progress of polishing is continuously discharged.

From the viewpoint of conducting CMP always under the same condition of the surface of the polishing cloth, the polishing method of the present embodiment preferably comprises a step of conditioning the polishing cloth before the CMP step. For example, the polishing cloth is conditioned with a liquid comprising at least water using a dresser with diamond particles. The polishing method of the present embodiment preferably comprises a step of washing the base after the CMP step. It is preferable to adequately wash the base after polishing in running water, then perform drying after removing droplets, which have attached onto the base, with the use of a spin dry or the like. In addition, it is more preferable to clean the base with a known cleaning method of removing the deposits on the base by pressing a brush made from polyurethane against the base with a constant pressure while letting a commercially available cleaning liquid flow on the surface of the base and rotating the brush, and then dry the base.

According to the polishing agent of the present embodiment, CMP of a base having a carbon-based material having a carbon content of 60 to 95 atm % as measured by X-ray photoelectron spectroscopy and an insulating material can be conducted to thereby remove at least a part of the carbon-based material. The polishing agent of the present embodiment can obtain a sufficiently small polishing rate of the insulating material. Therefore, CMP of a base having a carbon-based material and an insulating material to remove at least a part of the carbon-based material can be achieved with almost no progress in polishing after a part of the insulating material is exposed. Stated differently in words appreciated by those skilled in the art, such a polishing agent is "a polishing agent that can remove a carbon-based material and stop polishing when an insulating material is exposed".

Figure 2:
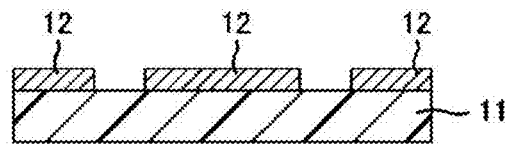
FIG. 2 is a schematic cross-sectional view illustrating a process for forming a fine pattern.
Figure 2:
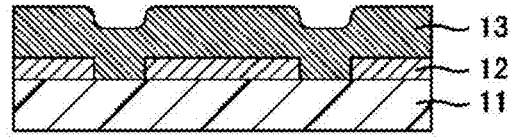
Figure 2:
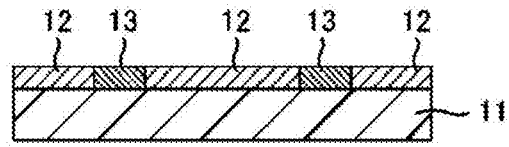
Figure 2:
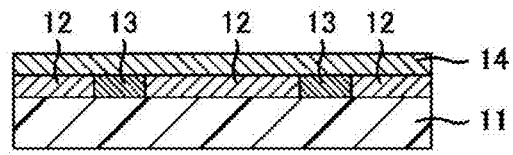
Figure 2:
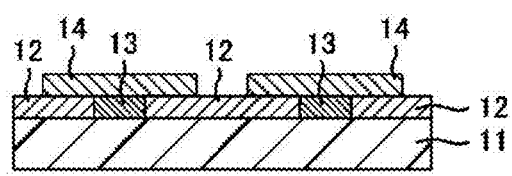
Figure 2:
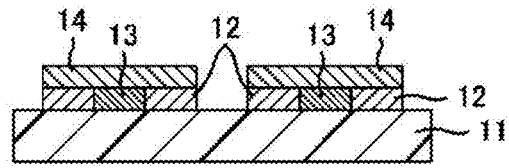
Figure 2:
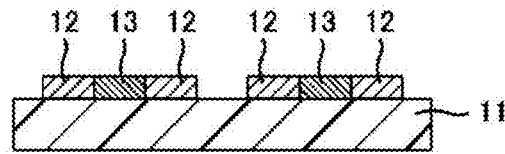
Figure 2:

Making the most of advantage described above, the polishing agent of the present embodiment can be used in a polishing method that needs a high polishing rate ratio of the carbon-based material with respect to the insulating material. Specific examples of application include double patterning. The polishing method of the present embodiment will be described by way of FIG. 2.

First, a base having a substrate 11 and silicon oxide 12 is provided wherein the silicon oxide 12 is formed on the substrate 11 and also has a prescribed pattern (FIG. 2(a)). A carbon-based material 13 is formed on the substrate 11 and silicon oxide 12 by applying and curing (FIG. 2(b)). The same pattern as that of silicon oxide 12 is formed on the surface of the carbon-based material 13. Generally, such a carbon-based material 13 is sometimes called as a sacrificial film.

Next, CMP of the surface layer portion of the carbon-based material 13 is conducted until silicon oxide 12 is exposed, to thereby planarize the surface constituted of the surface of silicon oxide 12 and the surface of the carbon-based material 13 (FIG. 2(c)). The surface of the base sufficiently planarized through the CMP process provides less projections and depressions that are formed when applying a photoresist thereto, which result in that the focal depth as well as yield are less likely to decrease. Since polishing of silicon oxide 12 after exposure of silicon oxide 12 is prevented, the surface of the base can be finished evenly. An antireflection film (BARC film) may be formed after the step of FIG. 2(c) before applying a photoresist.

Subsequently, a photoresist 14 is evenly applied to the surfaces of silicon oxide 12 and the carbon-based material 13 (FIG. 2(d)). Then, the mask pattern is transferred to the photoresist 14 using an exposure device. The base after transferring the pattern is heat-treated, and then, subjected to development to remove an unnecessary part of photoresist 14 (FIG. 2(e)).

Next, parts of silicon oxide 12 exposed between the photoresists 14 are removed by dry etching with a plasma gas or the like (FIG. 2(f)). Then, the photoresist 14 is peeled off using, for example, a solution of combinations of an ethanol amine compounds and an organic solvent (FIG. 2(g)). Further, the carbon-based material 13 is removed by wet etching (FIG. 2(h)). Through the foregoing process, a line-and-space pattern having a half pitch of that in the initial pattern of silicon oxide 12 (FIG. 2(a)) is formed.

The polishing rates of the carbon-based material and the insulating material are preferably the following rate from the viewpoint of suitability for application to double patterning. The polishing rate of the carbon-based material is preferably 100 nm/min or more, and more preferably 150 nm/min or more, from the viewpoint of reducing polishing time. The polishing rate of the carbon-based material is preferably 1000 nm/min or less, more preferably 600 nm/min or less, and even more preferably 500 nm/min or less, from the viewpoint of preventing excessive progress in polishing of the depressions in the carbon-based material to further improve planarity, and from the viewpoint of easily controlling polishing time. The polishing rate of the insulating material is preferably 4 nm/min or less, and more preferably 3 nm/min or less, from the viewpoint of easily controlling polishing time.

The polishing rate ratio of the carbon-based material with respect to the insulating material is preferably 50 or more, and more preferably 70 or more, from the viewpoint of preventing progress in polishing of the insulating material to easily finish the surface of the base evenly. The above-mentioned polishing rate ratio refers, for example, to the polishing rate ratio when polishing a blanket wafer having a carbon-based material formed on a substrate, and polishing a blanket wafer having an insulating material formed on a substrate. The polishing rate ratio can be evaluated, for example, by polishing a blanket wafer having a carbon-based material evenly formed on a substrate and a blanket wafer having an insulating material evenly formed on a substrate with the same polishing cloth at the same number of rotations under the same load.

EXAMPLES

The present invention will be described in more detail below by way of examples, but the present invention is not limited to these examples.

<Preparation of Polishing Agent>

Example 1

In a container, 0.500 parts by mass of malic acid (acid component) and 0.005 parts by mass of a polymer of methyldiallylamine amide sulfate (PAS-22SA-40, manufactured by NITTOBO MEDICAL CO., LTD.; weight average molecular weight 17000; having a structural unit of formula (II); hereinafter referred to as "allylamine-based polymer 1") were placed. Further, X parts by mass of extra pure water was poured thereinto, and then, stirring was performed to dissolve each components. Then, 1.000 part by mass of colloidal silica 1 having an average particle diameter of 70 nm was added thereto to obtain 100 parts by mass of a polishing agent. The surface of the abrasive grain was positively charged in the polishing agent. The amount of extra pure water, X parts by mass, was calculated to adjust such that the amount of the polishing agent became 100 parts by mass. The zeta potential of silica in the polishing agent according to Example 1 was 59.4 mV.

Example 2

A polishing agent was obtained in the same manner as in Example 1, except that 4.000 parts by mass of propylene glycol monopropyl ether was added as an organic solvent. The zeta potential of silica in the polishing agent according to Example 2 was 29.7 mV.

Example 3

A polishing agent was obtained in the same manner as in Example 1, except that as the allylamine-based polymer, 0.005 parts by mass of polyallylamine (PAA-01, manufactured by NITTOBO MEDICAL CO.,LTD.; weight average molecular weight 1600; having a structural unit of formula (I); hereinafter referred to as "allylamine-based polymer 2") was used in place of allylamine-based polymer 1. The zeta potential of silica in the polishing agent according to Example 3 was 18.9 mV.

Example 4

A polishing agent was obtained in the same manner as in Example 1, except that as the allylamine-based polymer, 0.005 parts by mass of a copolymer of diallyldimethylammonium chloride and acrylamide (PAS-J-81, manufactured by NITTOBO MEDICAL CO.,LTD.; weight average molecular weight 200000; having structural units of formulae (IV) and (IX); hereinafter referred to as "allylamine-based polymer 3") was used in place of allylamine-based polymer 1. The zeta potential of silica in the polishing agent according to Example 4 was 35.7 mV.

Example 5

A polishing agent was obtained in the same manner as in Example 1, except that as the allylamine-based polymer, 0.005 parts by mass of a copolymer of diallylamine hydrochloride and sulfur dioxide (PAS-92, manufactured by NITTOBO MEDICAL CO.,LTD.; weight average molecular weight 200000; having structural units of formulae (II) and (VII); hereinafter referred to as "allylamine-based polymer 4") was used in place of allylamine-based polymer 1. The zeta potential of silica in the polishing agent according to Example 5 was 27.7 mV.

Example 6

A polishing agent was obtained in the same manner as in Example 1, except that the content of the abrasive grain was changed from 1.000 part by mass to 0.200 parts by mass. The zeta potential of silica in the polishing agent according to Example 6 was 54.3 mV.

Example 7

A polishing agent was obtained in the same manner as in Example 1, except that the content of allylamine-based polymer 1 was changed from 0.005 parts by mass to 0.050 parts by mass. The zeta potential of silica in the polishing agent according to Example 7 was 55.3 my.

Example 8

A polishing agent was obtained in the same manner as in Example 1, except that the content of the abrasive grain was changed from 1.000 part by mass to 2.000 parts by mass and that the content of allylamine-based polymer 1 was changed from 0.005 parts by mass to 0.450 parts by mass. The zeta potential of silica in the polishing agent according to Example 8 was 54.8 mV.

Comparative Example 1

A polishing agent was obtained in the same manner as in Example 1, except that no allylamine-based polymer was used. The zeta potential of silica in the polishing agent according to Comparative Example 1 was 14.1 mV.

Comparative Example 2

A polishing agent was obtained in the same manner as in Example 1, except that alumina was used in place of silica as an abrasive grain. The zeta potential of silica in the polishing agent according to Comparative Example 2 was 37.2 mV.

Comparative Example 3

A polishing agent was obtained in the same manner as in Example 1, except that ceria (cerium oxide) was used in place of silica as an abrasive grain. The zeta potential of silica in the polishing agent according to Comparative Example 3 was 47.8 mV.

Comparative Example 4

A polishing agent was obtained in the same manner as in Example 1, except that 0.005 parts by mass of polyvinylpyrrolidone was used in place of allylamine-based polymer 1. The zeta potential of silica in the polishing agent according to Comparative Example 4 was 4.6 mV.

Comparative Example 5

A polishing agent was obtained in the same manner as in Example 1, except that 0.005 parts by mass of polyacrylamide was used in place of allylamine-based polymer 1. The zeta potential of silica in the polishing agent according to Comparative Example 5 was 3.9 mV.

Comparative Example 6

A polishing agent was obtained in the same manner as in Example 1, except that the content of the allylamine-based polymer was changed from 0.005 parts by mass to 0.450 parts by mass. The zeta potential of silica in the polishing agent according to Comparative Example 6 was 50.0 mV.

Comparative Example 7

A polishing agent was obtained in the same manner as in Example 1, except that the content of the allylamine-based polymer was changed from 0.005 parts by mass to 0.001 parts by mass. The zeta potential of silica in the polishing agent according to Comparative Example 7 was 39.6 mV.

Comparative Example 8

A polishing agent was obtained in the same manner as in Example 1, except that 1.000 part by mass of colloidal silica 2 (average particle diameter: 70 nm), having the surface modified with sulfonic acid, was used in place of colloidal silica 1. The zeta potential of silica in the polishing agent according to Comparative Example 8 was −0.4 mV.

<Measurement of pH of Polishing Agent> pH of the polishing agent was evaluated under the following conditions. The results are shown in Table 1 and Table 2.

Measurement temperature: 25±5° C.

Measurement device: product name: Model(F-51) from HORIBA, Ltd.

Measurement method: After conducting three-point calibration of the pH meter using a phthalate pH standard solution (4.01), a neutral phosphate pH standard solution (pH 6.86), and a borate pH standard solution (pH 9.18) as pH standard solutions, the electrode of the pH meter was placed in the polishing agent, and left to stand for two minutes or more to stabilize, and then the pH was measured with the above-mentioned measurement device.

<Evaluation of Polishing Properties>

As the bases which were the objects to be polished, a base obtained by forming a spin-on-carbon film (carbon-based material film) on a silicone substrate wherein the spin-on-carbon film has a carbon content of 89 atm % as measured by X-ray photoelectron spectroscopy (XPS) and a thickness of 200 nm; and a base obtained by forming a silicon dioxide film (insulating film) on a silicon substrate according to CVD method wherein the silicon dioxide film has a thickness of 1000 nm. Each of the bases that had been cut into 2 cm square was fixed to a holder of the polishing device (FACT-200, manufactured by Nano Factor Co., LTD) wherein a suction pad for attaching a base was attached to the holder. The holder was placed on a platen to which a polishing cloth of a polyurethane foam was attached, with the carbon-based material side downward. A weight was placed thereon so that the process load was 200 g/cm$^2$. While the polishing agent was dropped on the platen in an amount of 10 mL/min, the carbon-based material film and the insulating film were polished for 60 seconds at a number of rotations of the platen of 80 min$^{-1}$.

The polishing rate was calculated from the difference between the film thicknesses measured before and after polishing. Film thickness measurement device RE-3000 (manufactured by Dainippon Screen Mfg. Co., Ltd.) was used for measuring the film thickness. The polishing rate ratio was calculated by dividing the polishing rate of the carbon-based material film by the polishing rate of the insulating film. The results are shown in Table 1 and Table 2.

TABLE 1

|  |  | Example 1 | Example 2 | Example 3 | Example 4 | Example 5 | Example 6 | Example 7 | Example 8 |
|---|---|---|---|---|---|---|---|---|---|
| Abrasive Grain | Silica 1 | 1.000 | 1.000 | 1.000 | 1.000 | 1.000 | 0.200 | 1.000 | 2.000 |
| Polymer | Allylamine-Based Polymer 1 | 0.005 | 0.005 | — | — | — | 0.005 | 0.05 | 0.450 |
|  | Allylamine-Based Polymer 2 | — | — | 0.005 | — | — | — | — | — |
|  | Allylamine-Based Polymer 3 | — | — | — | 0.005 | — | — | — | — |
|  | Allylamine-Based Polymer 4 | — | — | — | — | 0.005 | — | — | — |
| Additives | Acid Component | 0.500 | 0.500 | 0.500 | 0.500 | 0.500 | 0.500 | 0.500 | 0.500 |
|  | Organic Solvent | — | 4.000 | — | — | — | — | — | — |
| Mass Ratio Allylamine-Based Polymer/Silica |  | 0.005 | 0.005 | 0.005 | 0.005 | 0.005 | 0.025 | 0.050 | 0.225 |
| pH of Polishing Agent |  | 2.6 | 2.6 | 2.6 | 2.6 | 2.5 | 2.6 | 2.6 | 2.4 |
| Zeta Potential (mV) |  | 59.4 | 29.7 | 18.9 | 35.7 | 27.7 | 54.3 | 55.3 | 54.8 |
| Evaluations | Polishing Rate of Carbon-Based Material Film (nm/min) | 564 | 421 | 517 | 542 | 482 | 214 | 324 | 207 |
|  | Polishing Rate of Insulating Film (nm/min) | 3 | 3 | 4 | 4 | 3 | 1 | 2 | 2 |
|  | Polishing Rate Ratio (Carbon-Based Material Film/ Insulating Film) | 188 | 140 | 129 | 136 | 161 | 214 | 162 | 104 |

TABLE 2

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Abrasive Grain | Silica 1 | 1.000 | — | — | 1.000 | 1.000 | 1.000 | 1.000 | — |
|  | Silica 2 | — | — | — | — | — | — | — | 1.000 |
|  | Alumina | — | 1.000 | — | — | — | — | — | — |
|  | Ceria | — | — | 1.000 | — | — | — | — | — |
| Polymer | Allylamine-Based Polymer 1 | — | 0.005 | 0.005 | — | — | 0.450 | 0.001 | 0.005 |
|  | Allylamine-Based Polymer 2 | — | — | — | — | — | — | — | — |
|  | Allylamine-Based Polymer 3 | — | — | — | — | — | — | — | — |
|  | Allylamine-Based Polymer 4 | — | — | — | — | — | — | — | — |
|  | polyvinyl-pyrrolidone | — | — | — | 0.005 | — | — | — | — |
|  | polyacrylamide | — | — | — | — | 0.005 | — | — | — |
| Additives | Acid Component | 0.500 | 0.500 | 0.500 | 0.500 | 0.500 | 0.500 | 0.500 | 0.500 |
|  | Organic Solvent | — | — | — | — | — | — | — | — |
| Mass Ratio Allylamine-Based Polymer/Silica |  | 0 | — | — | 0 | 0 | 0.450 | 0.001 | 0.005 |
| pH of Polishing Agent |  | 2.6 | 2.7 | 2.6 | 2.6 | 2.6 | 2.3 | 2.7 | 2.6 |
| Zeta Potential (mV) |  | 14.1 | 37.2 | 47.8 | 4.6 | 3.9 | 50.0 | 39.6 | −0.4 |

TABLE 2-continued

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Evaluations | Polishing Rate of Carbon-Based Material Film (nm/min) | 776 | 3 | 18 | 217 | 269 | 75 | 681 | 81.1 |
|  | Polishing Rate of Insulating Film (nm/min) | 29 | 1 | 21 | 8 | 6 | 2 | 17 | 4 |
|  | Polishing Rate Ratio (Carbon-Based Material Film/ Insulating Film) | 27 | 3 | 1 | 27 | 45 | 38 | 40 | 20 |

As shown in Table 1, in Examples, in comparison with Comparative Examples, the polishing rate of the carbon-based material film is high and the polishing rate of the insulating film is low, which result in a high polishing rate ratio of the carbon-based material film with respect to the insulating film.

When Example 1 and Example 3 are compared, the polishing rate of the carbon-based material film is particularly high and the polishing rate ratio is particularly high in Example 1 in comparison with Example 3. This is considered that the allylamine-based polymer in Example 1 is bulkier than that in Example 3, and therefore, the frequency of contact between the abrasive grain and the insulating film is easily decreased due to a steric hindrance effect.

Each of the allylamine-based polymer in Example 4 and Example 5 is a copolymer formed from allylamine-based compound and a compound other than allylamine-based compounds. In other words, in these allylamine-based polymers, the amount of a structural unit derived from an allylamine-based compound is small in comparison with the allylamine-based polymer in Example 1. Therefore, it is considered that the reason why the polishing rate of the carbon-based material film in Example 1 is higher than those in Example 4 and Example 5 is because the amount of the structural unit derived from an allylamine based compound is large. Moreover, a higher polishing rate of the carbon-based material film is obtained in Example 1 in comparison with Examples 2, 6 and 7.

In Example 8 in which both of the content of the allylamine-based polymer and that of the abrasive grain are high with a mass ratio of the content of the allylamine-based polymer with respect to that of the abrasive grain within a range of 0.002 to 0.400, the polishing rate of the carbon-based material film is lower than that in Example 1, but the polishing rate ratio of the carbon-based material with respect to the insulating film is higher than those in Comparative Examples.

As shown in Table 2, in Comparative Examples 1, 4, and 5 in which the respective polishing agent comprises no allylamine-based polymer, the polishing rate of the insulating film is high and the polishing rate ratio is small. It is considered that this is because a protective film which decreases the polishing rate of the insulating film is relatively hardly formed on the insulating film in these Comparative Examples.

In Comparative Examples 2 and 3 in each of which an abrasive grain of a different material from silica is used, the polishing rate of the carbon-based material film is low and the polishing rate ratio is small.

In Comparative Example 6 in which the mass ratio of the content of the allylamine-based polymer with respect to the content of the abrasive grain is high, the polishing rate of the carbon-based material film is low and the polishing rate ratio is small. It is considered that this is because the amount of the allylamine-based polymer adsorbed to the carbon-based material film is large.

In Comparative Example 7 in which the mass ratio of the content of the allylamine-based polymer with respect to the content of the abrasive grain is small, the polishing rate of the carbon-based material film is high, but the polishing rate ratio is small. It is considered that this is because the amount of the allylamine-based polymer adsorbed to the insulating film is small.

In Comparative Example 8 in which the absolute value of the zeta potential of silica in the polishing agent is very small, the polishing rate of the carbon-based material film is small.

REFERENCE SIGNS LIST

1, 11: Substrate, 2, 12: Silicon oxide, 3, 14: Photoresist, 4: Groove, 13: Carbon-based material.

The invention claimed is:

1. A polishing agent for chemomechanically polishing a base having a carbon-based material and an insulating material to remove at least a part of the carbon-based material,
   the carbon-based material having a carbon content of 60 to 95 atm% as measured by X-ray photoelectron spectroscopy,
   the polishing agent comprising:
   an abrasive grain comprising silica;
   an allylamine-based polymer; and
   water, wherein
   a mass ratio of a content of the allylamine-based polymer with respect to a content of the abrasive grain is 0.002 to 0.400, and
   the abrasive grain has a positive charge in the polishing agent.

2. The polishing agent according to claim 1, wherein the allylamine-based polymer has at least one selected from the group consisting of a structural unit represented by the following general formula (I), a structural unit represented by the following general formula (II), a structural unit represented by the following general formula (III), a structural unit represented by the following general formula (IV), and a structural unit represented by the following general formula (V)

[Chemical Formula 1]

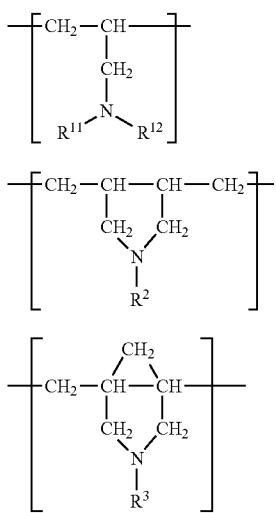

[In formulae, $R^{11}$, $R^{12}$, $R^2$ and $R^3$ each independently represent a hydrogen atom, an alkyl group or an aralkyl group, and the amino group and the nitrogen-containing ring each independently optionally form an acid addition salt]

[Chemical Formula 2]

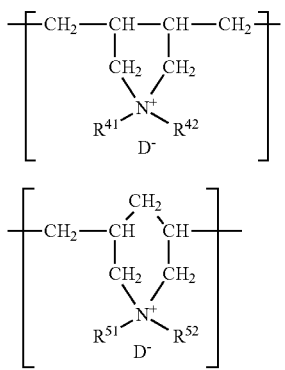

[In formulae, $R^{41}$ and $R^{42}$ each independently represent an alkyl group or an aralkyl group, $R^{51}$ and $R^{52}$ each independently represent an alkyl group or an aralkyl group, and D— represents a monovalent anion].

3. The polishing agent according to claim 1, wherein the silica is colloidal silica.

4. The polishing agent according to claim 1, further comprising an organic solvent.

5. The polishing agent according to claim 1, having a pH of 1.0 to 8.0.

6. The polishing agent according to claim 1, further comprising an acid component.

7. The polishing agent according to claim 1, wherein a polishing rate ratio of the carbon-based material with respect to the insulating material is 50 or more.

8. The polishing agent according to claim 1, wherein the polishing agent is stored in a form of a multi-pack polishing agent comprising:
   a first liquid comprising the abrasive grain and water, and
   a second liquid comprising the allylamine-based polymer and water.

9. A stock solution of a polishing agent for obtaining the polishing agent according to claim 1, the stock solution being diluted with water to obtain the polishing agent.

10. A polishing method comprising:
   a step of providing a base having a carbon-based material and an insulating material; and
   a polishing step of chemomechanically polishing the base using the polishing agent according to claim 1 to remove at least a part of the carbon-based material, wherein
   the carbon-based material has a carbon content of 60 to 95 atm% as measured by X-ray photoelectron spectroscopy.

11. A polishing method comprising:
   a step of providing a base having a carbon-based material and an insulating material;
   a step of diluting the stock solution of a polishing agent according to claim 9 with water to obtain the polishing agent; and
   a polishing step of chemomechanically polishing the base using the polishing agent to remove at least a part of the carbon-based material, wherein
   the carbon-based material has a carbon content of 60 to 95 atm% as measured by X-ray photoelectron spectroscopy.

12. The polishing method according to claim 10, wherein in the polishing step, polishing is stopped when the insulating material is exposed.

* * * * *